United States Patent [19]

Mattis

[11] 4,408,817

[45] Oct. 11, 1983

[54] P. C. BOARD BOBBIN CONSTRUCTION

[75] Inventor: Donald J. Mattis, Norwalk, Conn.

[73] Assignee: Sun Chemical Corporation, New York, N.Y.

[21] Appl. No.: 285,808

[22] Filed: Jul. 22, 1981

[51] Int. Cl.³ .......................................... H01R 13/70
[52] U.S. Cl. ............................. 339/147 R; 335/202; 339/12 R; 339/17 C
[58] Field of Search ............... 339/17 R, 17 C, 17 D, 339/143 T, 144 T, 184 T, 12, 147 R; 335/199, 202, 155

[56] References Cited

U.S. PATENT DOCUMENTS 2,772,380 11/1956 Andrew ....................... 339/17 D X
4,054,346 10/1977 Schultz ........................... 339/184 T Primary Examiner—Eugene F. Desmond
Attorney, Agent, or Firm—Cynthia Berlow

[57] ABSTRACT

A P. C. board bobbin and electrical component assembly or construction consisting of a cylindrical body of molded plastic substance which is adapted to mount one or more coils, and optionally to receive in its bore a reed switch capsule. One end of the body has an apertured wall to receive an eyelet by means of which the body can be readily mounted on end, on the board. As a separate piece, a terminal retainer sleeve can be fitted over an end portion of the body, such sleeve having at least one pair of aligned notches in its ends and at least one internal groove which is aligned with and connects to said notches. At least one terminal wire having a U-shaped portion is disposed in said groove and notches, said cylindrical body retaining the terminal wire in its operative position, and the wire having a projecting end portion adapted to extend through the hole in the P.C. board to effect connections thereto.

15 Claims, 15 Drawing Figures

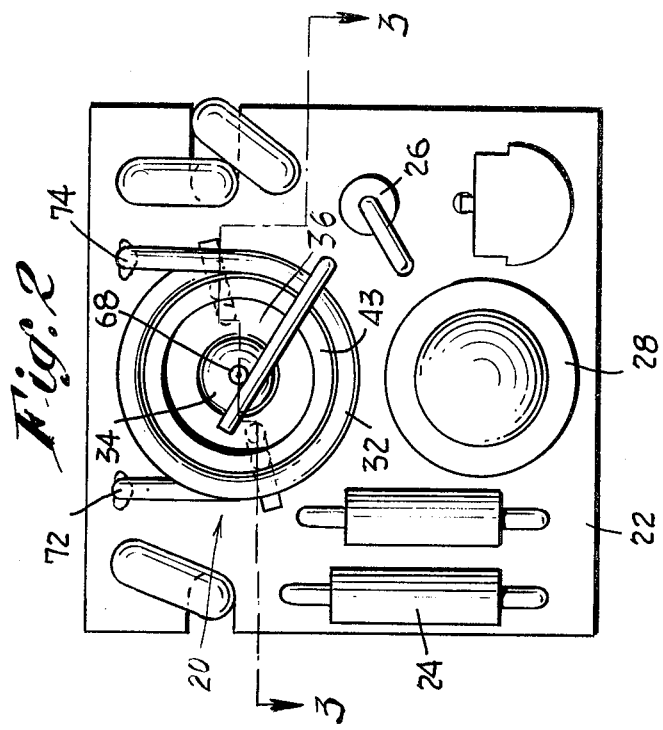
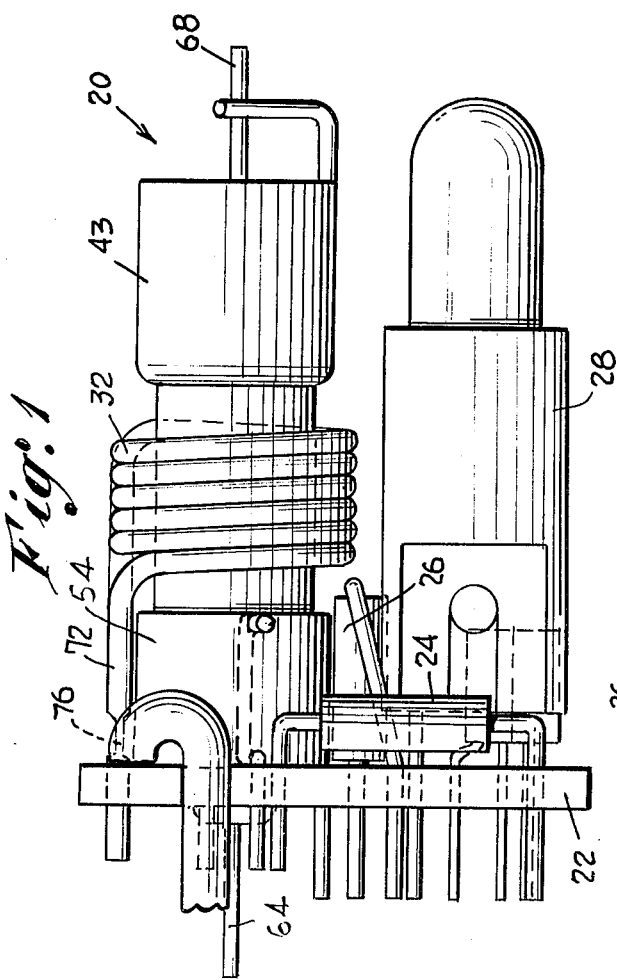
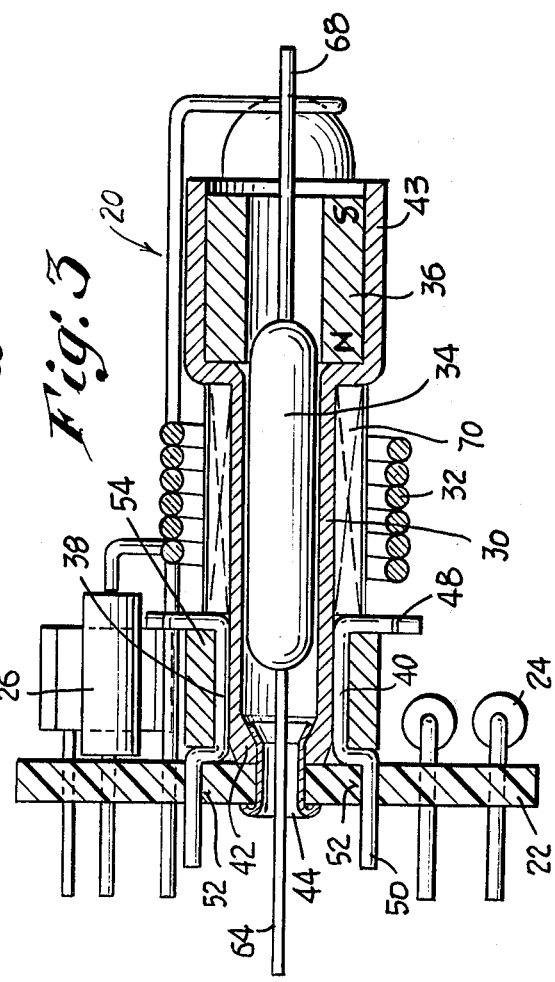

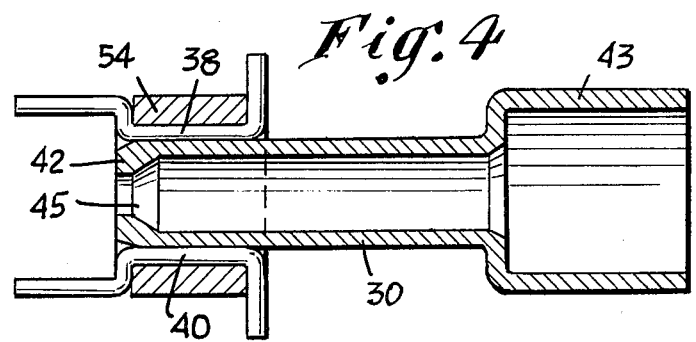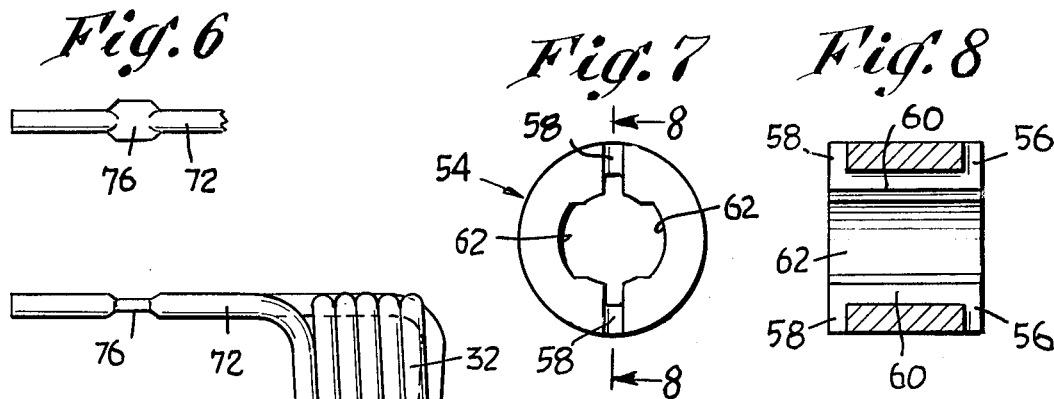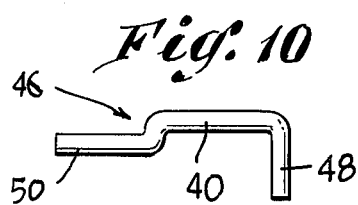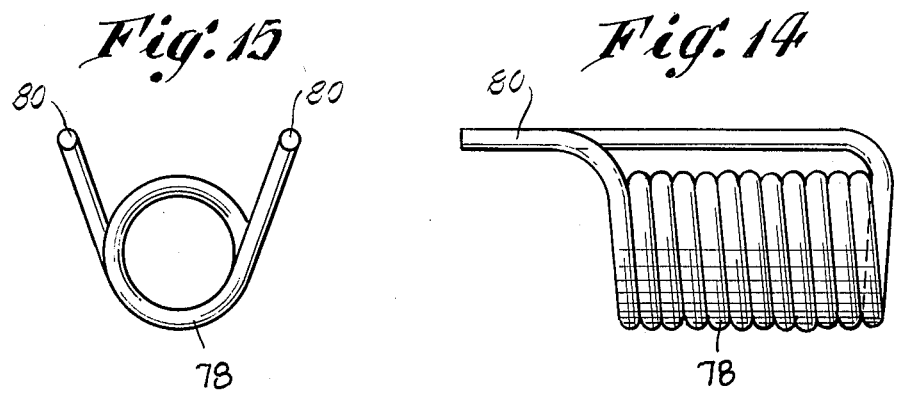

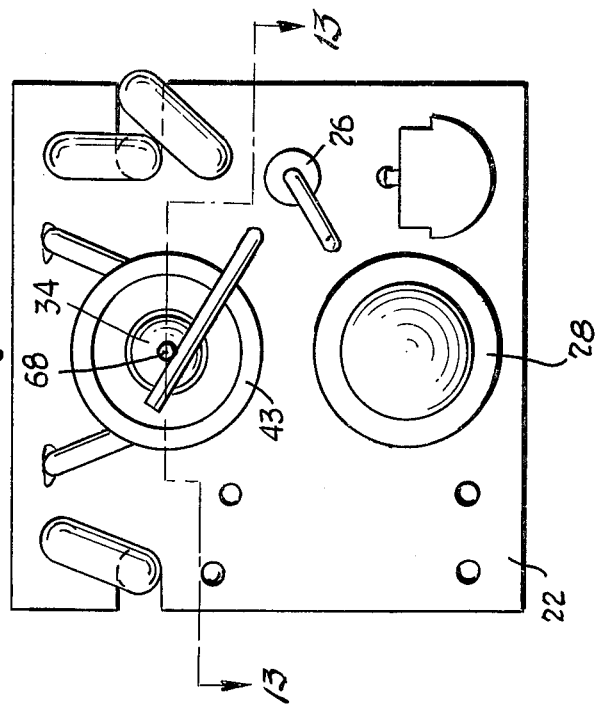
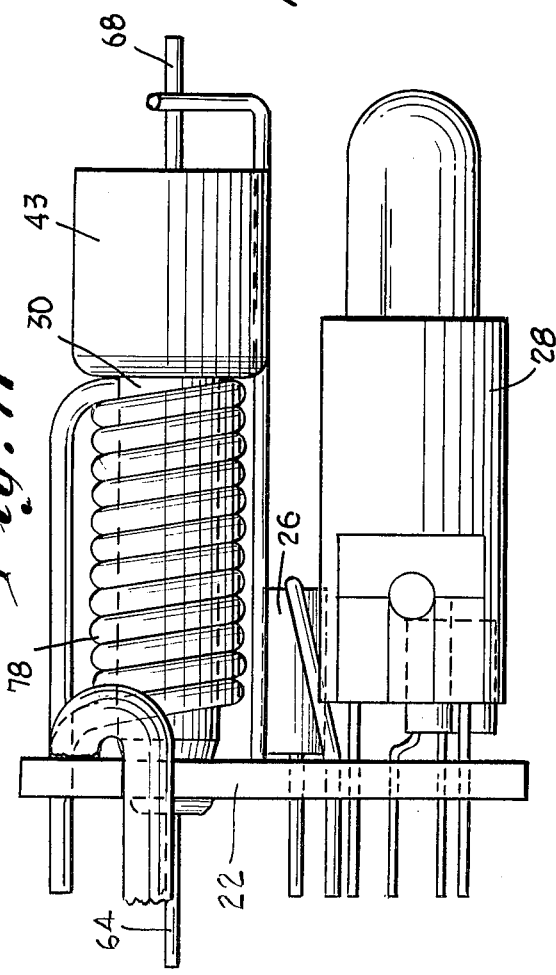
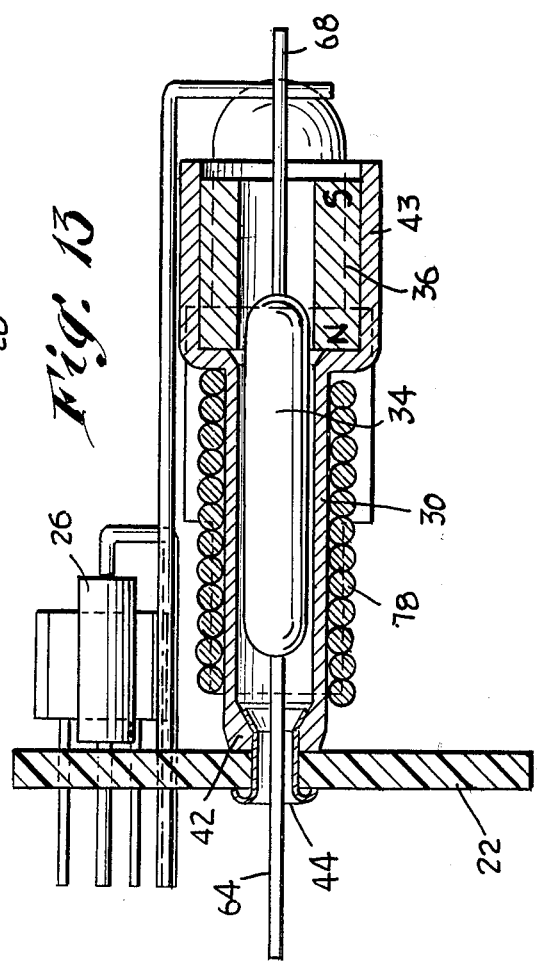

P. C. BOARD BOBBIN CONSTRUCTION

BACKGROUND

This invention relates to electrical component assemblages comprising bobbins of the type intended for mounting on P. C. (printed circuit) boards, and more particularly to such assemblages where electrical entities that are carried thereby require being connected to connection pins that are acceptable in openings in the P. C. board.

In the past various electrical entities or components, such as wound coils, switches or relays, lamp elements and the like, have been supported on bobbin-like forms which were provided with terminal pins arranged to be acceptable in the holes of a P. C. board. These forms were variously constituted as small tubes or other similar shapes, made of cardboard, plastic or the like, and the mounting devices for the forms were of various types, such as straight or angled shapes like small brackets affixed by the use of eyelets, rivets or like fastenings. The ends of a wound coil form, for example, were secured to rivets as by soldering, and the various connections to the switches, relays etc. were made to any terminal pins in the most convenient manner, depending on the electric configurations that were involved.

Generally these electrical components and the support bobbins are of small size, and the attachment of special brackets, terminal pins, prongs etc. represented a significant cost, especially where multiple rivets or eyelets are utilized, requiring the providing of holes in the coil form or bobbin, and cooperable configurations of brackets, terminal prongs etc.

The multiple parts employed, as well as the assembling of the same could not be readily handled by fast assembling operations, or with automatic or semi-automatic fixtures and the like. Additionally, there always existed the possibility of defective assemblies and rejects, as well as the necessity for large inventories of parts which had to be maintained.

The multiplicity of parts made the assemblies unnecessarily complicated, requiring an appreciable labor cost in addition to the expense of materials.

SUMMARY

The above drawbacks and disadvantages of small prior electrical components of the type intended for use with P. C. boards are obviated by the present invention, and one object of the invention is to provide a novel and improved electrical bobbin-type component for P. C. boards, wherein especially simple and effective mounting and terminal means are provided, these being particularly reliable and at the same time much less expensive to produce.

Another object of the invention is to provide an improved electrical bobbin-type component for assemblage to P. C. boards as above characterized, which can be fabricated to a great extent by automatic or semi-automatic equipment such as tools, fixtures, molds and the like.

Still another object of the invention is to provide an improved electrical component according to the foregoing and in the form of a relay having a bobbin assemblage with an associated reed switch, which is especially small and compact, and particularly inexpensive to produce.

Features of the invention reside in the provision of improved electrical bobbin-type components as above outlined, which can be produced of molded parts formed in simple mold cavities, in conjunction with simple stamped metal parts, and which are adaptable to a wide variety of uses in connection with printed circuits.

Still other features and advantages will hereinafter appear.

In accomplishing the above objects the invention provides an electrical component assemblage consisting essentially of a molded cylindrical body of plastic substance which can be utilized as a bobbin and additionally to receive in its bore a reed switch capsule. The cylindrical body has at one end an apertured transverse wall to receive a headed fastener, such as an eyelet, by which it can be in a simple manner end-mounted on the P. C. board. As a separate piece, a terminal retainer sleeve can be fitted over one end portion of the cylindrical body, such sleeve having one or more pairs of aligned notches in its ends and one or more internal grooves which are respectively aligned with and connect to the said notch pairs. Terminal wires having U-shaped portions are disposed in said grooves and notches, with the cylindrical body retaining the terminal wires in their operative positions. Each terminal wire has a projecting end portion parallel to the axis of the body and which is adapted to extend through a hole in the P. C. board to enable connections to be effected to electrical devices carried thereby.

The cylindrical body can have an end portion of enlarged diameter, to receive an annular permanent magnet, in those cases where reed switch capsules are to be carried in the body for the purpose of constituting a relay device.

One or more coils of wound wire can be supported by the bobbin-like cylindrical body, to influence the reed switch capsule. The terminal wires interlockingly engage the retainer sleeve and cylindrical body, and require no special or separate securing devices such as eyelets, rivets and the like, and the assembly of the wires, sleeve and body can be economically effected by automatic or semi-automatic fixtures.

In the accompanying drawings, illustrating in greatly enlarged scale several embodiments of the invention:

FIG. 1 is a side elevational view, of a P. C. board and component bobbin-type assemblage as provided by the invention.

FIG. 2 is a top plan view of the assemblage of FIG. 1.

FIG. 3 is an axial sectional view taken on the line 3—3 of FIG. 2.

FIG. 4 is an axial sectional view of the bobbin-like component assemblage supporting structure, per se.

FIG. 5 is a side elevational view of a wound coil constituting part of the assemblage of FIGS. 1-3.

FIG. 6 is a fragmentary top plan view of a flattened formation of one lead wire of the coil of FIG. 5.

FIG. 7 is an end elevational view of the terminal retainer sleeve of the component assemblage.

FIG. 8 is a diametric section of the retainer sleeve, taken on the line 8—8 of FIG. 7.

FIG. 9 is a side elevational view of the retainer sleeve.

FIG. 10 is a side elevational view of a terminal wire constituting a portion of the component assemblage.

FIG. 11 is a side elevational view of a P. C. board and electrical component assemblage made according to the invention, illustrating a modification thereof.

FIG. 12 is a top plan view of the assemblage of FIG. 11.

FIG. 13 is a section, taken on the line 13—13 of FIG. 12.

FIG. 14 is a side elevational view of a wound coil of the assemblage of FIGS. 11-13, and FIG. 15 is an end elevational view of the coil of FIG. 14.

Referring first to FIGS. 1-10, the improved electrical component bobbin-type assemblage is designated generally by the numeral 20, such assemblage being mounted on a P. C. (printed circuit) board 22 which has other components, such as those designated 24, 26 and 28 mounted thereon. The components 24, 26 and 28 constitute no part of the present invention, and are illustrated merely to show an environment where the component assemblage 20 can be utilized.

As seen in FIGS. 3 and 4, the component assemblage 20 comprises a cylindrical body 30 which is of molded plastic substance, and is adapted to support separate electrical entities, such as a wound coil 32, a reed switch capsule 34 and an annular permanent magnet 36, as well as separate and distinct, preformed terminal wires 38, 40.

The body 30 has a reduced-diameter end portion 42 at one end of its bore, formed as a transverse, apertured end wall and has a portion 43 of enlarged diameter at the other end of its bore.

In accordance with the present invention a novel construction is provided for mounting the body 30. The apertured end wall 42 can receive a headed fastener, such as the eyelet 44 by means of which it can be end-mounted easily and quickly on the P. C. board 22. The wall 42 has a flared mouth 45 which acts as a lead-in when placing the eyelet 44 in the wall.

Additionally, a novel construction is provided for mounting the terminal wires 38, 40 which permits a fast and economical assemblage of the wires, as by automatic or semi-automatic machinery or fixtures.

As seen in FIGS. 4 and 10, the terminal wires 38, 40 are identical to each other, each having a U-shaped portion generally designated 46 in FIG. 10, and connector portions 48 and 50, the latter being adapted to pass through an opening in the board 22, designated 52 in FIG. 3.

The U-shaped portion 46 is seen to have a yoke part at the place indicated by the lead line 40, which is parallel to the connector or extremity terminal portion 50, and to have two legs, one designated 48 whereas the other, which is opposite and parallel thereto, joins together the parts indicated by the lead lines 40 and 50.

This novel construction embraces the provision of a retainer sleeve 54 which is adapted to be fitted over the small end portion 42 of the body 30, held either by a press fit thereon or else by suitable cement. The retainer sleeve 54 has pairs of aligned notches 56, 58 in its ends, and has internal grooves 60 respectively aligned with and connecting to the paired notches 56, 58 whereby U-shaped recesses are formed in the sleeve 54 for slidably receiving and closely fitting the wires 40 and 38 by a translational movement of the wires, wherein the legs thereof at the ends of the yoke part move essentially endwise during the receiving movement. The U-shaped portion 46 of the terminal wire 38 is adapted to be received in a groove 60 and pair of notches 56, 58 of the retainer sleeve, and to be held in such position when the small end portion 42 of the body 30 is inserted in the sleeve, all as clearly illustrated in FIG. 4.

Preferably the retainer sleeve 54 has internal cutouts or spaces 62 in its bore, providing reliefs so that the fitting of the sleeve 54 on the body 30 can be more easily effected. This is especially desirable where the body 30 and sleeve 54 are molded of plastic substance such as Delrin (a registered Trademark), inasmuch as the inherent resilience of the plastic material enables the fit tolerances to be more generous than if the components 30, 54 were to be formed of less resilient materials, in which case closer attention would have to be paid to the mating diameters.

The connector portions 50 of the terminal wires 38, 40 extend generally parallel to the axis of the body 30, as seen in FIG. 4, thereby to enable the assemblage to be readily applied to the P. C. board with the portions 50 occupying suitable apertures in the board.

As seen in FIG. 3, the reed switch capsule 34 can be accommodated in the bore of the body 30, and terminal 64 of the capsule can entend through the eyelet 44 by which the small end portion of the body 30 is secured to the board 22. The other terminal 68 of the reed switch capsule can extend through the bore of the annular magnet 36 as seen in FIG. 3.

Annular space exists between the enlarged end portion 43 of the body and the retainer sleeve 54, and a small coil 70 can be wound in the said space prior to the assemblage of the sleeve to the body. The heavier coil 32, being of larger diameter, can be readily slipped over the portion 43 of the body, to its designated position, and the two terminal portions 72, 74 of the coil 32 can be brought parallel to the axis of the body 30 and through suitable openings in the P. C. board.

As seen in FIGS. 2, 5 and 6, such terminal portions of the coil 32 can have flattened areas 76 which constitute stops by their engagement with the surface of the P. C. board, so as to properly position the coil with respect to the body 30.

It will be seen that, by the provision of the grooved and notched retainer sleeve 54 in conjunction with the body 30 and the terminal wires 38, 40, a simple and effective assemblage is provided by the invention, which furnishes a reliable means for bringing connections through the board from, for example, the coil 70 whose ends are joined to the respective portions 48 of the terminal wires.

It will be understood that the coil 70 can advantageously be wound directly onto the bobbin body 30 after the assembly of the retainer sleeve 54 and terminal wires 38, 40 has been effected. The portions 48 of the wires will not protrude from the end of the retainer sleeve 54 since they occupy the end notches 56. Thus, there is no need to employ a separate coil form for the coil 70 but instead it can be wound directly on the assemblage of body 30, retainer sleeve 54 and terminal wires.

Another embodiment of the invention is illustrated in FIGS. 11-15, wherein like components have been given similar characters.

In this embodiment of the invention, the retainer sleeve 54 is omitted, and the coil 70 is omitted and replaced by a wound coil 78 of heavier wire, which is slipped directly over the main portion of the body 30. Mounting of the body 30 to the P. C. board 22 is effected by the eyelet 44, as previously described, and the terminal portions 80 of the coil 78 have right-angle bends and are brought through suitable openings of the board 22.

It will now be seen from the foregoing that I have provided a novel and improved electrical component bobbin-type assembly for P. C. boards, which may be economically produced in large quantities of molded plastic substance, and easily and quickly assembled to the board by the use of quick, automatic or semi-automatic equipment.

Variations and modifications are possible without departing from the spirit of the invention.

I claim:

1. A P. C. board electrical component assembly comprising, in combination:
   (a) a holder in the form of a cylindrical body adapted to support electrical entities,
   (b) a terminal retainer sleeve fitted over one end of said cylindrical body,
   (c) said retainer sleeve having aligned notches in both its ends and having an aligned internal groove connecting said notches and forming a U-shaped recess, and
   (d) a terminal wire constituted as a piece separate and apart from said body and sleeve, said terminal wire having a rigid U-shaped portion, which is slidably received and disposed in said groove and notches and closely fits therein, said terminal wire being received in said recess with essentially a purely translational movement wherein the legs of the wire move essentially endwise during the receiving movement,
   (e) said cylindrical body engaging the terminal wire and constituting a means for retaining the latter in said groove and notches,
   (f) said terminal wire having an extremity terminal portion which is essentially parallel to the yoke part of the U-shaped portion, and which is adapted for insertion in an opening of a printed circuit board, and said wire being pre-formed.

2. The invention as defined in claim 1, wherein:
   (a) said cylindrical body has an enlarged diameter at one end, to receive and support an annular permanent magnet.

3. The invention as defined in claim 1, wherein:
   (a) said terminal wire has an extremity which extends parallel to the axis of the cylindrical body.

4. The invention as defined in claim 1, and further including:
   (a) a second terminal wire,
   (b) said retainer sleeve having additional aligned notches in its ends and an additional internal groove connecting and aligned with said additional notches,
   (c) said second terminal wire having a U-shaped portion which is disposed in said additional groove and notches.

5. The invention as defined in claim 1, wherein:
   (a) said retainer sleeve is pressfitted on the cylindrical body.

6. The invention as defined in claim 1, wherein:
   (a) said cylindrical body and retainer sleeve are constituted of molded plastic substance.

7. The invention as defined in claim 1, wherein:
   (a) said retainer sleeve is cemented on the cylindrical body.

8. The invention as defined in claim 1, wherein:
   (a) said body is of molded plastic substance and has at one end portion a transverse apertured wall to receive a headed fastener by which the body can be mounted on end on the P. C. board.

9. A P. C. board electrical component assembly comprising, in combination:
   (a) a holder in the form of a cylindrical body adapted to support electrical entities,
   (b) a terminal retainer sleeve fitted over one end of said cylindrical body,
   (c) said retainer sleeve having aligned notches in its ends and an aligned internal groove connecting said notches, and
   (d) a terminal wire having a U-shaped portion, which is disposed in said groove and notches,
   (e) said cylindrical body retaining the terminal wire in said groove and notches,
   (f) one end of the cylindrical body having an internal shoulder constituting a stop for positioning an annular permanent magnet supported in said body.

10. A P. C. board electrical component assembly comprising, in combination:
    (a) a holder in the form of a cylindrical body adapted to support electrical entities,
    (b) a terminal retainer sleeve fitted over one end of said cylindrical body,
    (c) said retainer sleeve having aligned notches in its ends and an aligned internal groove connecting said notches, and
    (d) a terminal wire having a U-shaped portion, which is disposed in said groove and notches,
    (e) said cylindrical body retaining the terminal wire in said groove and notches,
    (f) said cylindrical body having an enlarged diameter at one end, to receive and support an annular permanent magnet,
    (g) said terminal retainer sleeve being spaced from the portion of enlarged diameter of the cylindrical body, to accommodate an electrical coil, and
    (h) a wound coil disposed in said space between the retainer sleeve and the enlarged body portion.

11. A P. C. board electrical component assembly comprising, in combination:
    (a) a holder in the form of a cylindrical body adapted to support electrical entities,
    (b) a terminal retainer sleeve fitted over one end of said cylindrical body,
    (c) said retainer sleeve having aligned notches in its ends and an aligned groove connecting said notches, and
    (d) a terminal wire having a U-shaped portion, which is disposed in said groove and notches,
    (e) said cylindrical body retaining the terminal wire in said groove and notches,
    (f) a second terminal wire,
    (g) said retainer sleeve having additional aligned notches in its ends and an additional internal groove connecting and aligned with said additional notches,
    (h) said second terminal wire having a U-shaped portion which is disposed in said additional groove and notches,
    (i) said cylindrical body being adapted to receive in its bore a reed switch capsule,
    (j) a coil carried by said cylindrical body and surrounding the bore thereof,
    (k) a reed switch capsule in the bore of the cylindrical body, and
    (l) said coil and capsule being connected to said terminal wires.

12. The invention as defined in claim 11, wherein:

(a) said cylindrical body has an enlarged diameter at one end, and
(b) an annular permanent magnet disposed in said enlarged diameter portion of the cylindrical body.

13. A P. C. board bobbin construction comprising, in combination:
(a) a cylindrical body of molded plastic substance, adapted to mount an electrical coil,
(b) one end portion of said body having a transverse apertured wall to receive a headed fastener by which the body can be mounted on end, on the board, and
(c) an integral external annular shoulder on said body, spaced from said end thereof,
(d) said shoulder constituting a stop against which a coil that encircles the body, can be placed,
(e) the other end portion of the body being of enlarged diameter to receive an annular permanent magnet,
(f) said end portion of enlarged diameter providing, with the remainder of the body, the said external annular shoulder, and providing additionally an internal annular shoulder constituting a stop against which the magnet can be placed.

14. The invention as defined in claim 13, wherein:
(a) the transverse apertured wall of the body end portion has a tapered mouth surrounding the aperture thereof, to provide a lead-in for the headed fastener.

15. The invention as defined in claim 13, and further including:
(a) an eyelet passing through the aperture of the transverse wall, and constituting the said headed fastener.

* * * * *